United States Patent
Morein et al.

(10) Patent No.: US 11,469,214 B2
(45) Date of Patent: Oct. 11, 2022

(54) STACKED ARCHITECTURE FOR THREE-DIMENSIONAL NAND

(71) Applicant: Xcelsis Corporation, San Jose, CA (US)

(72) Inventors: Stephen Morein, San Jose, CA (US); Javier A. Delacruz, San Jose, CA (US); Xu Chang, San Jose, CA (US); Belgacem Haba, Saratoga, CA (US); Rajesh Katkar, San Jose, CA (US)

(73) Assignee: Xcelsis Corporation, San Jose, CA (US)

( * ) Notice: Subject to any disclaimer, the term of this patent is extended or adjusted under 35 U.S.C. 154(b) by 0 days.

(21) Appl. No.: 16/523,222

(22) Filed: Jul. 26, 2019

(65) Prior Publication Data

US 2020/0203316 A1    Jun. 25, 2020

Related U.S. Application Data

(60) Provisional application No. 62/784,422, filed on Dec. 22, 2018.

(51) Int. Cl.
| | |
|---|---|
| *H01L 25/065* | (2006.01) |
| *H01L 25/18* | (2006.01) |
| *H01L 25/00* | (2006.01) |
| *H01L 23/00* | (2006.01) |

(52) U.S. Cl.
CPC .......... *H01L 25/0657* (2013.01); *H01L 24/08* (2013.01); *H01L 24/80* (2013.01); *H01L 25/18* (2013.01); *H01L 25/50* (2013.01); *H01L 2224/08145* (2013.01); *H01L 2224/80006* (2013.01); *H01L 2224/80894* (2013.01); *H01L 2225/06524* (2013.01); *H01L 2924/1431* (2013.01); *H01L 2924/14511* (2013.01)

(58) Field of Classification Search
CPC ................. H01L 25/0657; H01L 25/50; H01L 2224/80006; H01L 2924/1431
See application file for complete search history.

(56) References Cited

U.S. PATENT DOCUMENTS

| | | | |
|---|---|---|---|
| 5,739,067 A | 4/1998 | DeBusk et al. | |
| 6,728,161 B1 | 4/2004 | Roohparvar | |
| 6,906,361 B2 | 6/2005 | Zhang | |
| 6,962,835 B2 | 11/2005 | Tong et al. | |
| 7,354,809 B2 | 4/2008 | Yuan et al. | |
| 7,593,263 B2 | 9/2009 | Sokolov et al. | |
| 7,968,440 B2 | 6/2011 | Seebauer | |
| 8,399,974 B1 | 3/2013 | Huneke | |
| 8,581,349 B1 | 11/2013 | Sekar et al. | |
| 8,735,219 B2 | 5/2014 | Enquist et al. | |
| 9,190,345 B1 * | 11/2015 | Chen ................. | H01L 21/76898 |

(Continued)

*Primary Examiner* — Fernando L Toledo
*Assistant Examiner* — Valerie N Newton
(74) *Attorney, Agent, or Firm* — Haley Guiliano LLP

(57) ABSTRACT

Aspects of the disclosure relate to forming stacked NAND with multiple memory sections. Forming the stacked NAND with multiple memory sections may include forming a first memory section on a sacrificial substrate. A logic section may be formed on a substrate. The logic section may be bonded to the first memory section. The sacrificial substrate may be removed from the first memory section and a second memory section having a second sacrificial substrate may be formed and bonded to the first memory section.

20 Claims, 18 Drawing Sheets

(56) References Cited

U.S. PATENT DOCUMENTS

| | | |
|---|---|---|
| 9,437,582 B2 | 9/2016 | Gibson et al. |
| 10,074,667 B1* | 9/2018 | Higashi ............. H01L 27/11553 |
| 10,672,674 B2* | 6/2020 | Yu ........................... H01L 21/56 |
| 2013/0020707 A1 | 1/2013 | Or-Bach et al. |
| 2013/0178024 A1 | 7/2013 | Flachowsky et al. |
| 2015/0019802 A1 | 1/2015 | Kamal et al. |
| 2015/0279816 A1* | 10/2015 | Chen .................... H01L 23/528 |
| | | 257/774 |
| 2020/0105735 A1 | 4/2020 | Park et al. |

* cited by examiner

100

STACKED ARCHITECTURE FOR THREE-DIMENSIONAL NAND

CROSS-REFERENCE TO RELATED APPLICATION

The present application claims the benefit of the filing date of U.S. Provisional Patent Application No. 62/784,422 filed Dec. 22, 2018, the disclosure of which is hereby incorporated herein by reference.

BACKGROUND

NAND memory is a non-volatile storage technology. NAND memory provides large storage capacity with quick access times and low power usage within a robust package, making it commonplace in many modern electronic devices, such as solid-state hard drives, smart phones, flash drives, memory cards, computers, etc. The density of NAND memory, which is the number of memory cells found on a single die, defines the storage capacity for NAND memory.

Decreasing the size of the memory cells may increase the density of the memory cells and, therefore, the storage capacity of the NAND memory. Logic benefits from memory cells with sizes in the 7 nm and below range, but given the emergence of 3D NAND, discussed herein, including memory cells which have multiple voltages per cell, it may be more advantageous for larger cells in the 32 nm range. Additionally, reductions in the size of the memory cells may lead to instability, such as the loss of data, e.g., electric charges, within the memory cells. Further, the cost to further reduce the size of memory cells may also be very expensive, as production cost would be significant.

To overcome the density limitations, three-dimensional (3D) NAND was developed. As used herein, 3D NAND memory, also called vertical NAND (V-NAND), may include two-dimensional arrays of memory cells, as found in planar NAND, stacked in vertical layers on a die to form memory cell stacks, referred to as memory pyramids in three-dimensions. Although the term memory pyramid is used to describe the memory cell stacks, the memory cell stacks may be in other shapes, such as a staircase type shape, box shape, etc. By stacking the memory cells vertically, the density of the NAND memory is significantly increased without the need for a further reduction in memory cell size, although further reduction in memory cell size would further increase the density of the NAND memory. However, stacking layers of memory cells vertically becomes difficult beyond a certain level. In this regard, via integrity, also referred to as channel hole integrity, may be difficult to achieve as the vias may be subjected to twisting, bowing, size variation, incomplete etching, and other such issues as the height of a 3D NAND is increased. The productions methods used to avoid these via integrity issues may require increased production time, further adding to the expense of producing 3D NAND. Moreover, as more layers of memory cells are added to the NAND memory, the distance from the logic of the NAND memory is increased vertically, resulting slower read and write performance of the NAND memory. The slowdown from stacking memory cells may be exacerbated when larger arrays of memory cells having larger page sizes are stacked, as the horizontal distance is added to the vertical distance.

Memory cells having more than one voltage per cell, which may be considered another type of 3D NAND memory, may suffer from reductions in speed. In this regard, SLC single level cells (SLCs), which include a single voltage, are generally the fastest as there are two states (i.e., 1 or 0). Multi-level cells (MLCs) which have two voltages, may have 4 states and can represent 2 bits (i.e., 00, 01, 10, & 11.) Tri-level cells (TLCs) and quad-level cells (QLCs) may have 8 and 16 voltages respectively, which would represent 3-bits and 4-bits respectively. However, increases in the number of voltage levels within a memory cell may require slower read and write times in order to make sure the correct level is written and read accurately. Therefore, QLC is generally used for cold-storage of data and SLC is generally used for high speed storage.

NAND memory includes logic for handling the reading and writing of the NAND memory cells and the input and output (I/O) from the NAND memory. In other words, the logic controls the NAND memory's operation and communication with other components, such as processors. The logic is typically constructed as complementary metal-oxide-semiconductor (CMOS) circuits, which operate at low voltage. In contrast, the memory section in the NAND memory including bit lines, word lines, and memory cells, operate at a higher voltage. The higher voltage of the memory section of the NAND memory may produce heat which may degrade the CMOS circuitry in the logic. Stacked NAND, which is formed by combining a discrete logic section formed on one die with a memory section formed on another die via hybrid bonding pads may reduce the thermal effects the memory section has on the logic section. However, stacked NAND still suffers from the density limitations of planar and 3D NAND.

BRIEF SUMMARY

The present disclosure relates to memory with multiple memory sections. One aspect includes a method of forming stacked memory with multiple memory sections. The method may include forming a first memory section on a sacrificial substrate and forming a logic section on a substrate. The logic section may be bonded to the first memory section and the sacrificial substrate may be removed from the first memory section. A second memory section having a second sacrificial substrate may be formed and the second memory section may be bonded with the first memory section.

In some instances, the second memory section may be bonded to a surface of the first memory section opposite another surface of the first memory section where the logic section is bonded.

In some instances, the first memory section may include a first set of hybrid bonding pads and the logic section may include a second set of hybrid bonding pads, and bonding the first memory section to the logic section may include bonding the first set of hybrid bonding pads to the second set of hybrid bonding pads. In some examples, upon removing the sacrificial substrate, an additional set of hybrid bonding pads may be formed on a second surface of the first memory section, wherein the second surface is opposite a surface where the first set of hybrid bonding pads are formed. In some examples, the bonding of the second memory section to the first memory section may include bonding the additional set of hybrid bonding pads to a set of hybrid bonding pads on the second memory section.

In some instances, the second sacrificial substrate may be removed and an additional set of hybrid bonding pads may be formed on a second surface of the second memory section, wherein the second surface is opposite a surface where the second memory section is bonded to the first memory section. In some examples a third memory section may be bonded to the second surface of the second memory section, wherein bonding the third memory section and the second memory section includes bonding a set of hybrid bonding pads on the third memory section to the additional set of hybrid bonding pads of the second memory section.

In some instances, the logic section may be bonded to the first memory section and bonding the second memory section to the first memory section may include ZiBond direct bonding and/or direct bond interconnect (DBI) hybrid bonding.

In some examples, the first memory section may include a first set of vias and the second memory section includes a second set of vias, and bonding the additional set of hybrid bonding pads and the set of hybrid bonding pads on the second memory section may connect one or more of the first set of vias with one or more of the second set of vias. In some examples, one or more of the first set of vias may be connected to a memory pyramid in the first memory section and one or more of the second set of vias may be connected to a memory pyramid in the second memory section.

Another aspect of the disclosure includes a stacked memory with multiple memory sections (SNMMS) comprising a first memory section, a second memory section, and a logic section. The logic section may be bonded to a first surface of the first memory section and the second memory may be bonded to a second, opposite surface of the first memory section.

In some instances the first memory section may include a first set of bonding pads and the logic section may include a second set of bonding pads, and first set of hybrid bonding pads may be bonded to the second set of hybrid bonding pads. In some examples the first memory section may include an additional set of hybrid bonding pads formed on a second surface of the first memory section, wherein the second surface is opposite the first surface where the first set of hybrid bonding pads are formed. In some examples the second memory section may include a set of hybrid bonding pads, wherein the set of hybrid bonding pads of the second memory section are bonded to the additional set of hybrid bonding pads. In some examples, the first memory section may include a first set of vias and the second memory section may include a second set of vias, and one or more of the first set of vias may be connected to the second set of vias by one or more of the additional set of hybrid bonding pads bonded to the hybrid bonding pads of the second memory section.

In some instances, the SNMMS may include a third memory section bonded to the second memory section.

In some instances the first memory section and the second memory section may each include a memory pyramid having at least one layer of memory cells.

In some instances, the SNMSS may further comprise one or more word lines, wherein the same layers in the memory pyramids are connected to the same word line. In some examples, the same layers in the memory pyramids sum to a single page size.

In some instances, the logic section may be bonded to the first memory section via ZiBond direct bonding and/or direct bond interconnect (DBI) hybrid bonding.

DETAILED DESCRIPTION

While the following disclosure provides a number of examples, it should be understood that the concepts and techniques are not limited to specific examples, but rather can be more broadly applied. For example, while the examples herein may refer to NAND memory, it should be understood that the technology described in such examples could also be applied to other devices and memory types, such as universal flash storage (UFS), solid state memory, or other such volatile and non-volatile memory including MRAM, NRAM, FE-RAM, etc.

FORMING STACKED NAND WITH MULTIPLE MEMORY SECTIONS (SNMMS)

Figure 1:
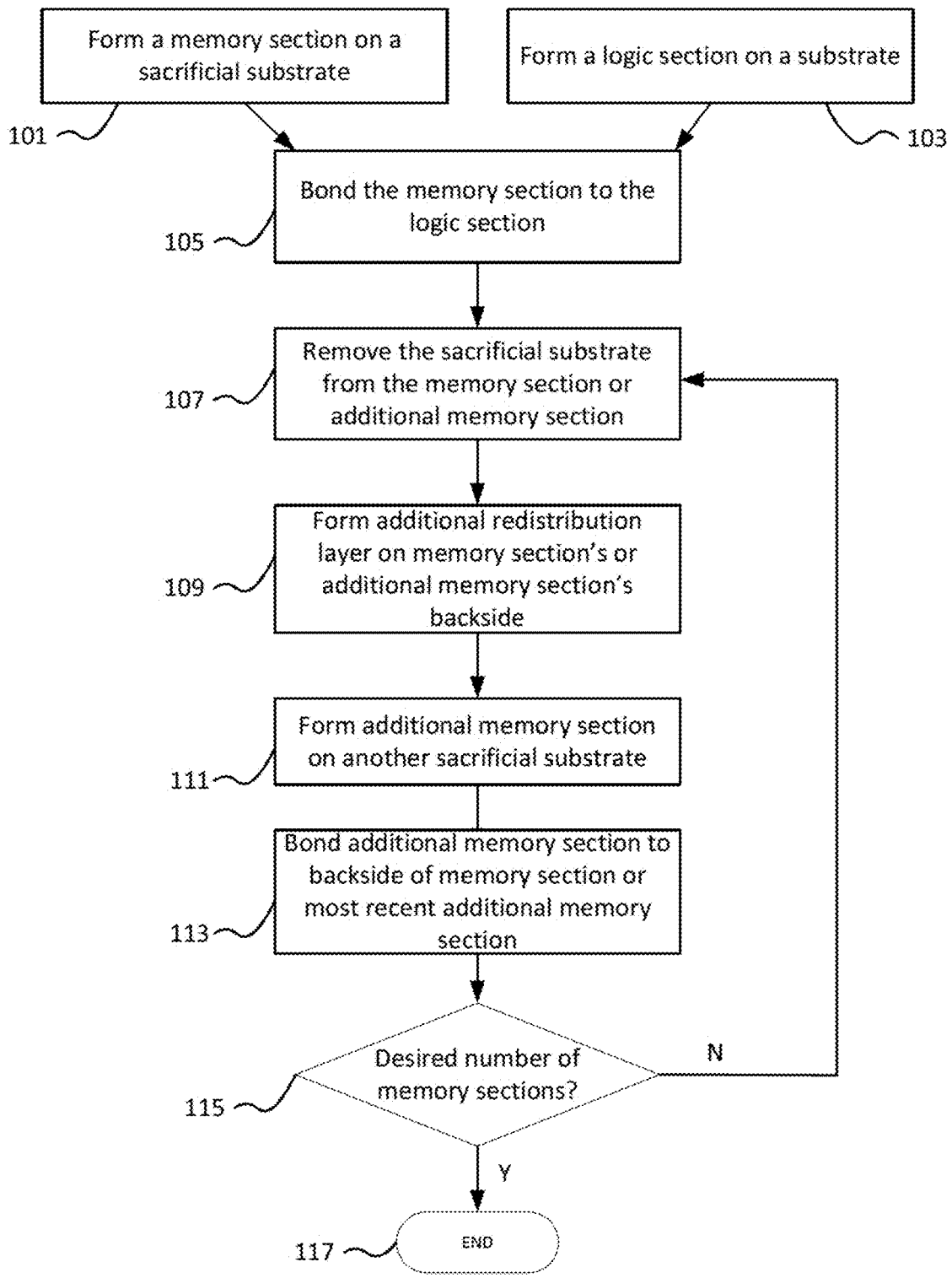
FIG. 1 is an example flow diagram in accordance with aspects of the disclosure.

Some aspects of the technology relate to stacking memory sections, that each includes at least one memory pyramid, and a single logic section to form a stacked NAND with multiple memory sections. FIG. 1 illustrates a flow chart 100 outlining the procedure for stacking memory sections on a logic section. In this regard, a memory section, including a memory pyramid, is formed on a sacrificial substrate and a logic section is formed on a substrate, as shown in blocks 101 and 103. The memory section is then bonded to the logic layer, as shown in block 105. The sacrificial substrate of the memory section may then be removed from the memory section, exposing the backside of the memory section, as shown in block 107. A connection layer may be formed on the backside of the memory section, as shown in block 109. An additional memory section, including another memory pyramid, may be formed on a sacrificial substrate and the additional memory may be bonded to the backside of the exposed backside of the memory section, as shown in blocks 111 and 113. Upon reaching the number of desired memory sections, the SNMMS may be complete as shown in blocks 115 and 117. Otherwise, if additional memory sections are needed, the steps in blocks 107-113 may be repeated.

Although FIG. 1 illustrates the memory section and logic section being formed simultaneously, the memory section and logic section may be formed at different times. In some instances, any number of memory sections may be bonded together before the logic section is bonded to the stack of memory sections. In other words, steps 107-115 may be performed any number of times before logic is bonded to the top most memory section or the base memory section. In some instances, additional memory sections may be bonded to the stacked NAND after the logic section is bonded to one of the memory sections.

Figure 2:
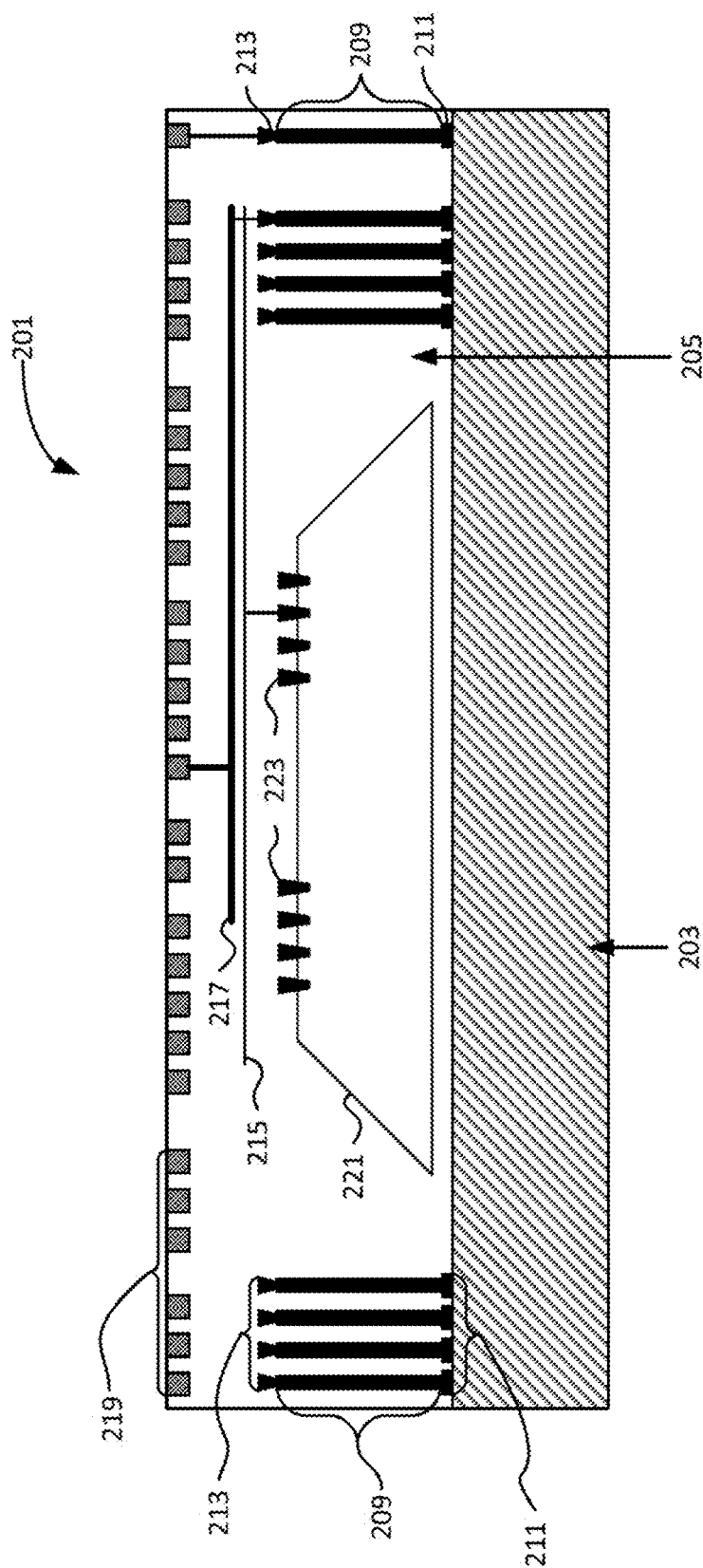
FIG. 2 is an example of a memory section in accordance with aspects of the disclosure.

FIG. 2 illustrates an example memory section 201 formed on a sacrificial substrate 203, as provided in block 101 of FIG. 1. The memory section 201 includes an oxide layer 205, in which memory pyramid 221 is positioned The memory pyramid 221 may include alternating layers of oxide and nitride stacked on top of a substrate. Each layer of oxide and nitride may be 3 or 4 nanometers thick, or more or less. In some instances the alternating layers of the memory pyramid 221 may include polysilicon in place of, or in addition to the nitride. The substrate of the memory pyramid 221 may be silicon or another material. The alternating layers of the memory pyramid may allow for the formation of one or more bit lines and word lines which provide read and write access to the memory cells (not shown) within the memory pyramid. Each bit line of the memory pyramid 221 may have connector, such as connector 223, which is configured to attach the bit lines to one or more through-stack vias 209 via a respective bit line interconnect, such as bit line interconnect 215. Although FIG. 2 illustrates the memory pyramid 221 tapering towards the top side of the memory section 201 where the hybrid bonding pads 219 are formed, the memory pyramid may be in any orientation within the memory section 201.

Through-stack vias 209 provide connections between the memory pyramid 221 and other memory sections, logic sections, and/or other components as described herein. Each via 209 may include one or more landing pads 211 and interconnects 213. The landing pads 211 and interconnects 213 provide connection points for the vias 209 to hybrid bonding pads 219, bit line interconnects 215, and/or a redistribution layer 217. The vias 209, landing pads 211, interconnects 213, bit line interconnects 215, and hybrid bonding pads 219 may be tungsten, copper, and/or any other suitable conductive material for carrying signals and/or bonding, as described herein. For clarity, not all connectors 223, vias 209, landing pads 211, interconnects 213, and hybrid bonding pads 219 shown in FIG. 2 are labeled. Further, the number of components shown within the memory section 201, such as vias 209, landing pads 211, interconnects 213, and/or hybrid bonding pads 211, bit line interconnect 215, redistribution layer 217, and hybrid bonding pads 219 is simply for illustration. There may be hundreds, thousands, tens or hundreds of thousands, or more of these components within the memory section 201. Additionally, FIG. 2 illustrates the memory section 201 from a side view, thereby providing only a two-dimensional view of the memory section 201. Additional components in the memory section may be found in the third dimension.

Figure 3:
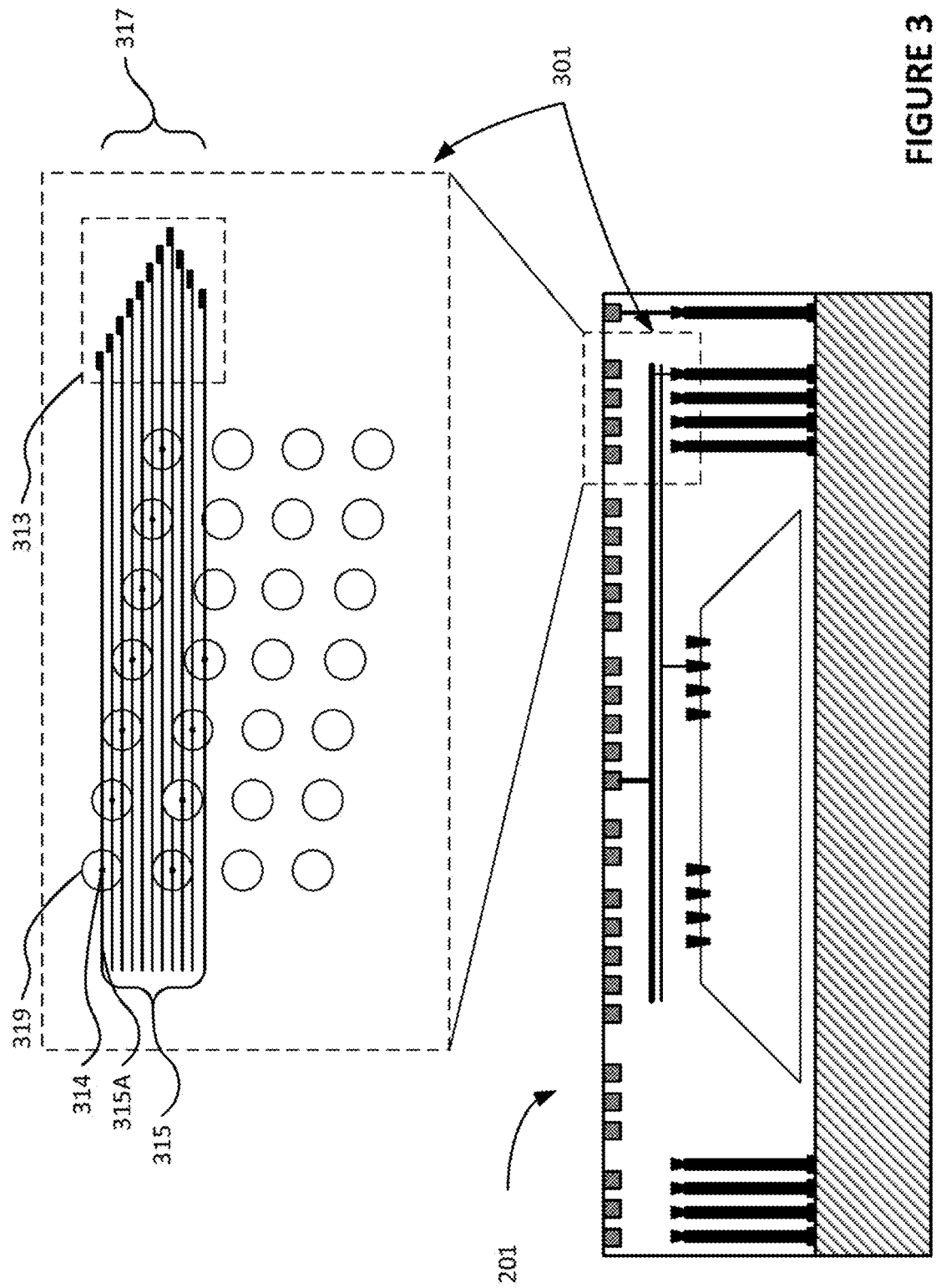
FIG. 3 illustrates an exploded, top down view of bit line interconnects attaching to interconnects in accordance with aspects of the disclosure.

FIG. 3 includes an exploded, top down view of bit line interconnects 315 attaching to interconnects 313 of through-stack vias, such as vias 209, and a redistribution layer 317 at section 301 of the memory section 201. In this regard, each bit line interconnect 315 may attach to an interconnect of a via at an attachment point. For instance example, a bit line interconnect 315A is shown as attaching to interconnect 313 at connection point 314. For illustration clarity, only a single attachment point and interconnect is labeled. The bit line interconnects 315 may have a 40 nm pitch, or more or less.

Each interconnect 313 may attach to a line in the redistribution layer 317. In this regard, the redistribution layer 317 may include a line for each via and/or bit line interconnect 315. The vias may have a 560 nm array pitch, or more or less. The lines of the redistribution layer 317 may each attach to a respective bonding pad, such as hybrid bonding pads 219 via one or more other vias 319. In some instances, the lines of the redistribution layer may tie directly to the interconnects 313. In other words, each bit line interconnect may attach to a respective interconnect of a via. Each respective interconnect may be connected to a line in the redistribution layer which may each terminate at a respective bonding pad. As used herein, redistribution layer may include hybrid bonding pads.

The sacrificial substrate 203 may be a material capable of providing physical support for forming the rest of the memory section, including oxide layer 205, and the components incorporated therein. The sacrificial substrate 203 may be a silicon, such as a polycrystalline silicon or amorphous silicon. In this regard, since the sacrificial substrate will be removed, either partially or completely, lower grade silicon is preferable for its lower cost. However, the use of monocrystalline silicon as the sacrificial substrate 203 is possible. In some instances, the sacrificial substrate may be sapphire, quartz, glass, or other material. In some instances, the sacrificial substrate 203 may be silicon on insulator (SOI). The use of SOI as at least part of the sacrificial substrate substrate may provide convenient etch stops for the silicon removal discussed herein.

Figure 4:
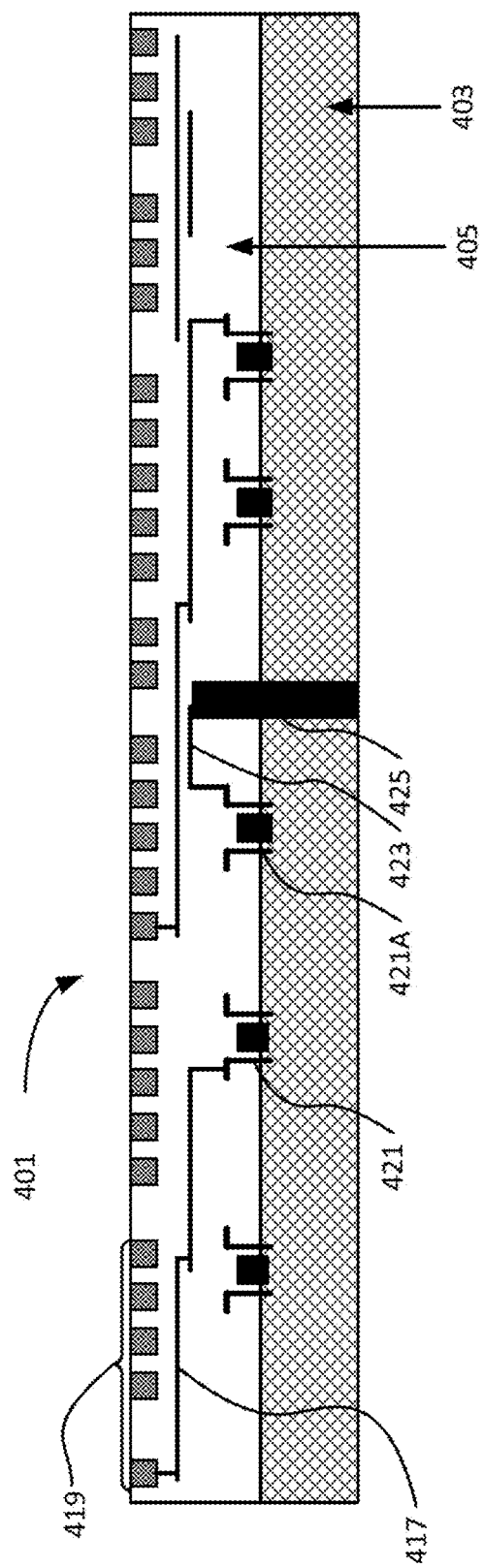
FIG. 4 is an example illustration of a logic section in accordance with aspects of the disclosure.

FIG. 4 illustrates an example logic section 401 formed on a silicon substrate 403, as provided in block 103 of FIG. 1. The logic section 401 includes an oxide layer 405 positioned on the silicon substrate 403. Although oxide layer 405 is shown as being positioned on the silicon substrate, any other dielectric may be used, such as nitride. Hybrid bonding pads 419, which mirror the layout of the hybrid bonding pads 219 of the memory section 201 are positioned on the top side of the logic section—that is to say, the hybrid bonding pads 419 are on the side opposite of the silicon substrate 403. Lines within a distribution layer 417 may connect one or more of the hybrid bonding pads 419 with one or more transistors, such as transistors 421 and 421A. The transistors may connect to components external to the logic section through a via. For example, logic section 401 includes a via 425 formed through the silicon substrate 403. The via 425 connects to transistor 421A through interconnection 423.

Figure 5:
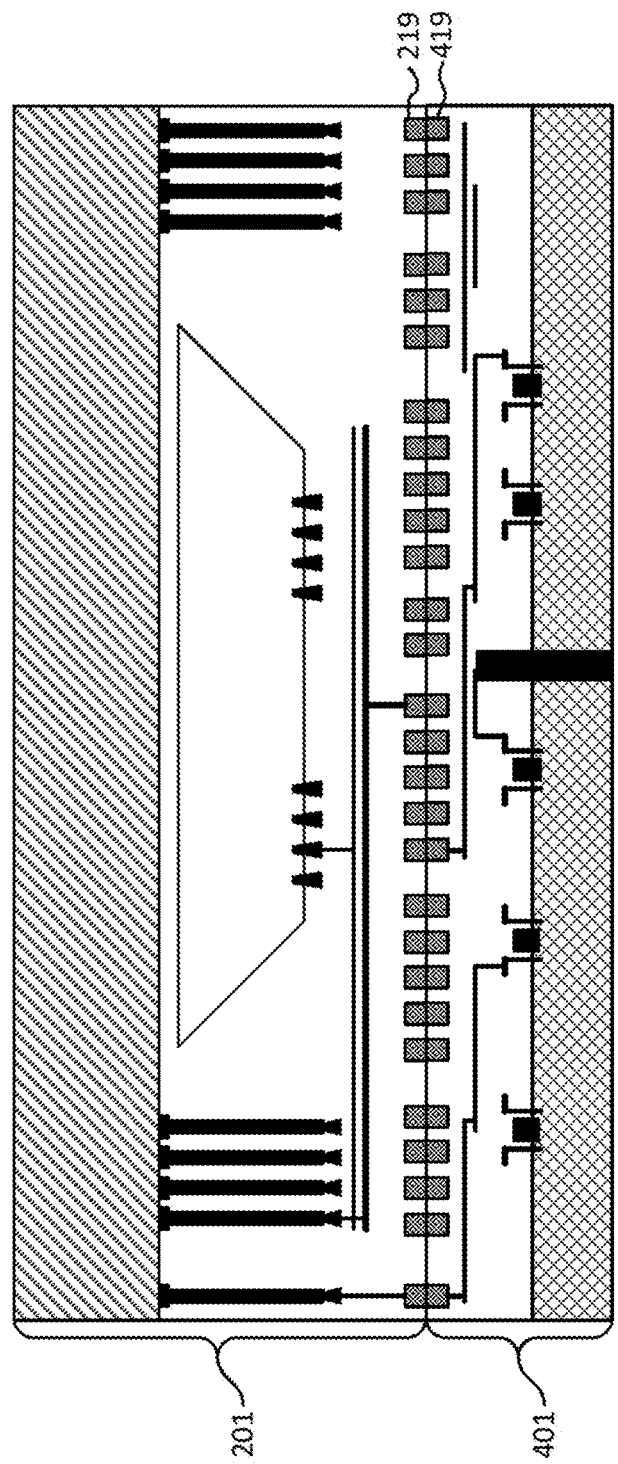
FIG. 5 is an example illustration of a memory section bonded with a logic section in accordance with aspects of the disclosure.

FIG. 5 illustrates the bonding of the memory section 201 to the logic section 401, as outlined in block 105 of FIG. 1. In this regard, memory section 201 or the logic section 401 may be inverted and positioned such that the hybrid bonding pads 219 of the memory section 201 are aligned and in contact with the mirrored hybrid bonding pads 419 of the logic section 401. The hybrid bonding pads may then be bonded together. For example, the bonding may be done using various bonding techniques, including using direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). DBI may include bonding the hybrid bonding pads 219 of the memory section 201 with the hybrid bonding pads 419 of the logic section 401 by heating and subsequently annealing the hybrid bonding pads such that they connect together. By bonding the hybrid bonding pads 419 of the logic section 401 with the hybrid bonding pads 219 of the memory section 201, the connection between the logic section 401 and memory section 201 may be made without the need for through silicon vias (TSVs). In some instances, the surfaces of the memory section 201 and logic section 401 having the hybrid bonding pads may be polished prior to bonding the hybrid bonding pads together.

Figure 6:
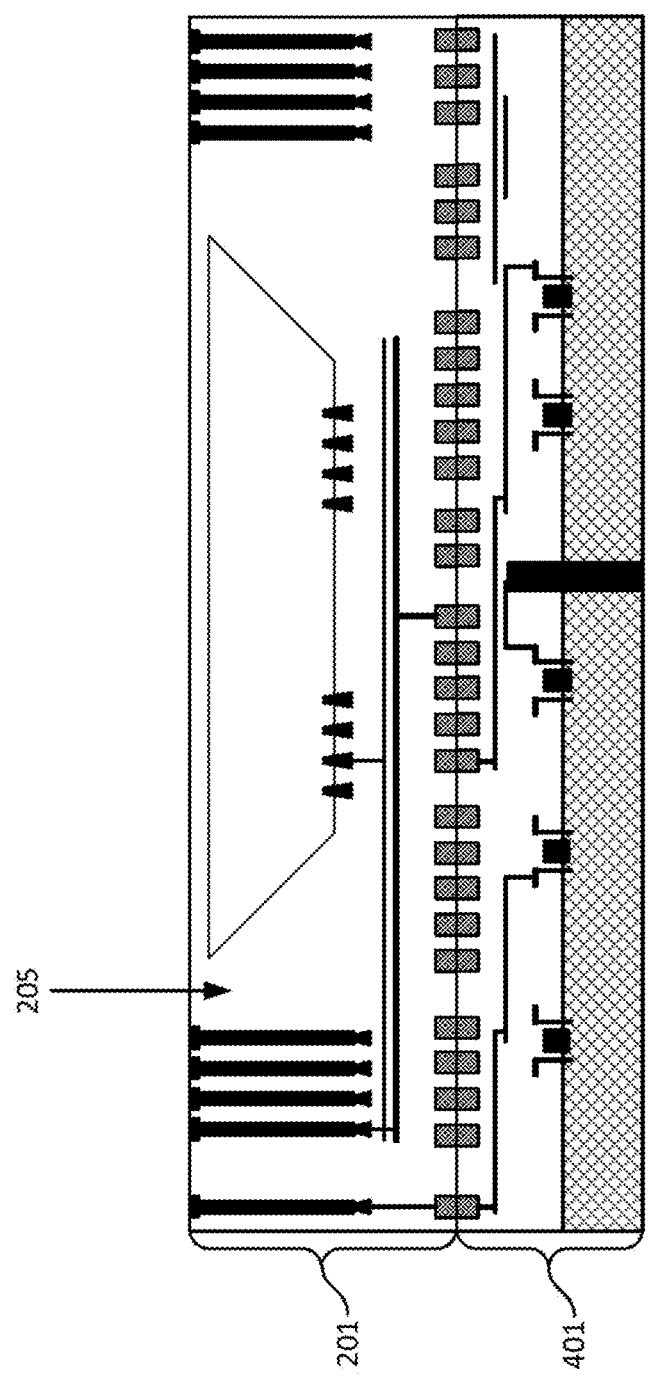
FIG. 6 is an example illustration of a memory section with a removed sacrificial substrate, bonded to a logic section in accordance with aspects of the disclosure.

FIG. 6 illustrates the removal of the sacrificial substrate 203 from the memory section 201, as outlined in block 107 of FIG. 1. The removal of the sacrificial substrate 203 may be done using, for example, chemical mechanical planarization ("CMP"), back grinding, etching, or the like. Although FIG. 6 illustrates the removal of the entire sacrificial substrate 203, in some instances the sacrificial substrate may not be fully removed. Rather, the sacrificial substrate 203 may be thinned to allow for easier manufacturing of fine pitch silicon vias.

Figure 7:
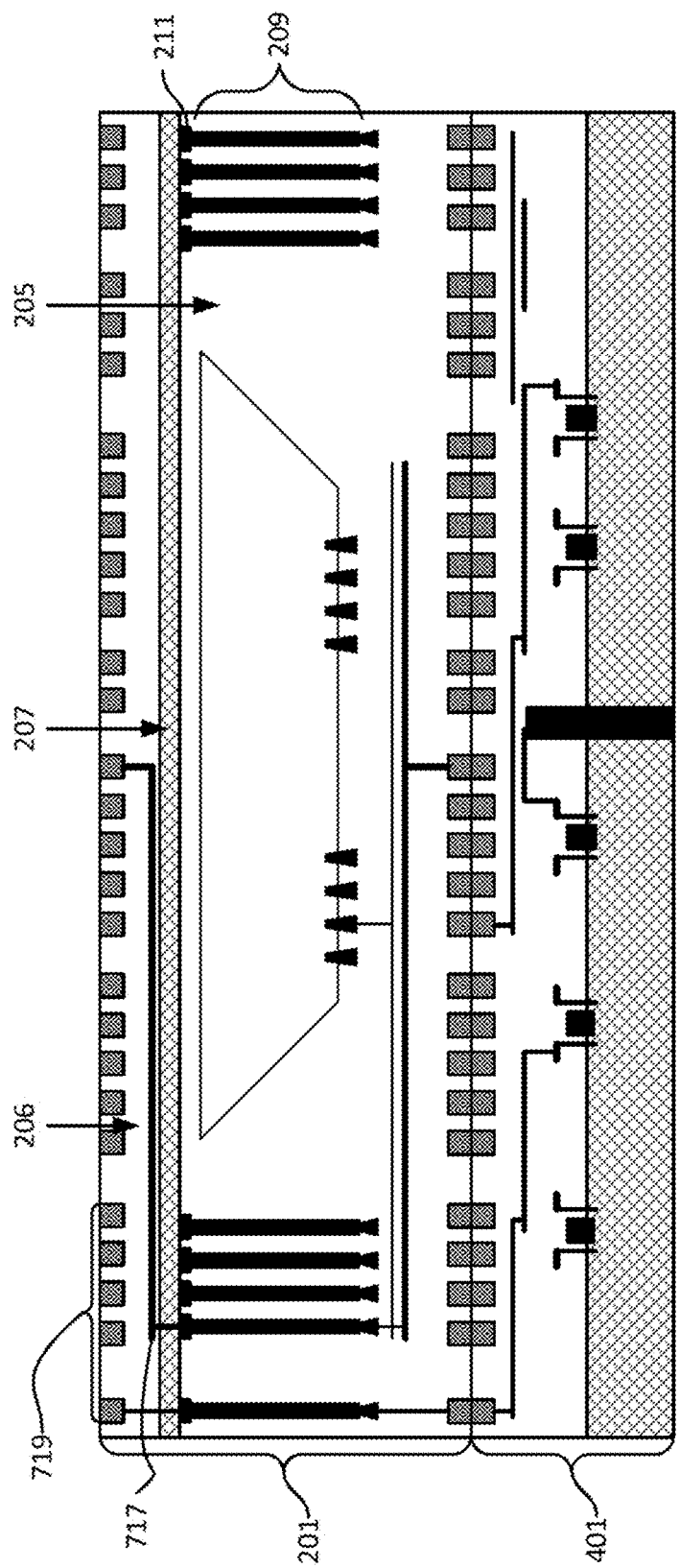
FIG. 7 is an example illustration of a memory section showing an additional redistribution layer formed on an oxide layer in accordance with aspects of the disclosure.

After removal of the sacrificial substrate, a dielectric layer, such as nitride layer 207 may be formed on oxide layer 205. An additional dielectric layer, like oxide layer 206 may then be formed on top of the nitride layer 207 to "sandwich" the nitride layer 207 between the two oxide layers 207 and 205, as shown in FIG. 7. The additional layers may provide layers for forming a redistribution layer for connecting to additional memory sections as described herein. In some instances, the additional dielectric layer 206 may be formed from alternating dielectrics, such as oxide and nitride. Moreover, the order of dielectric layers in FIG. 7 is for illustration purposes only. The exact order of dielectric layers, such as oxide and nitride layers, may be reversed and or different materials may be used. Although not shown in FIG. 7, vias may be formed through nitride layer 207 prior the additional oxide layer 206 being added. These vias may or may not shift position from oxide to nitride layers and vice versa.

FIG. 7 further illustrates the formation of an additional routing layer 717 within oxide layer 206 and nitride layer 207, as outlined in block 109 of FIG. 1. The additional routing layer 717 may include additional hybrid bonding pads 719 formed on the periphery of the oxide layer 206. The lines of the additional routing layer 717 may connect vias to the additional hybrid bonding pads 719 by connecting the landing pads 211 of the vias 209 to respective additional hybrid bonding pads 719. Although FIG. 7 illustrates the additional routing layer 717, the additional routing layer may be removed or its size reduced if the landing pads of the vias are aligned with the hybrid bonding pads.

Figure 8:
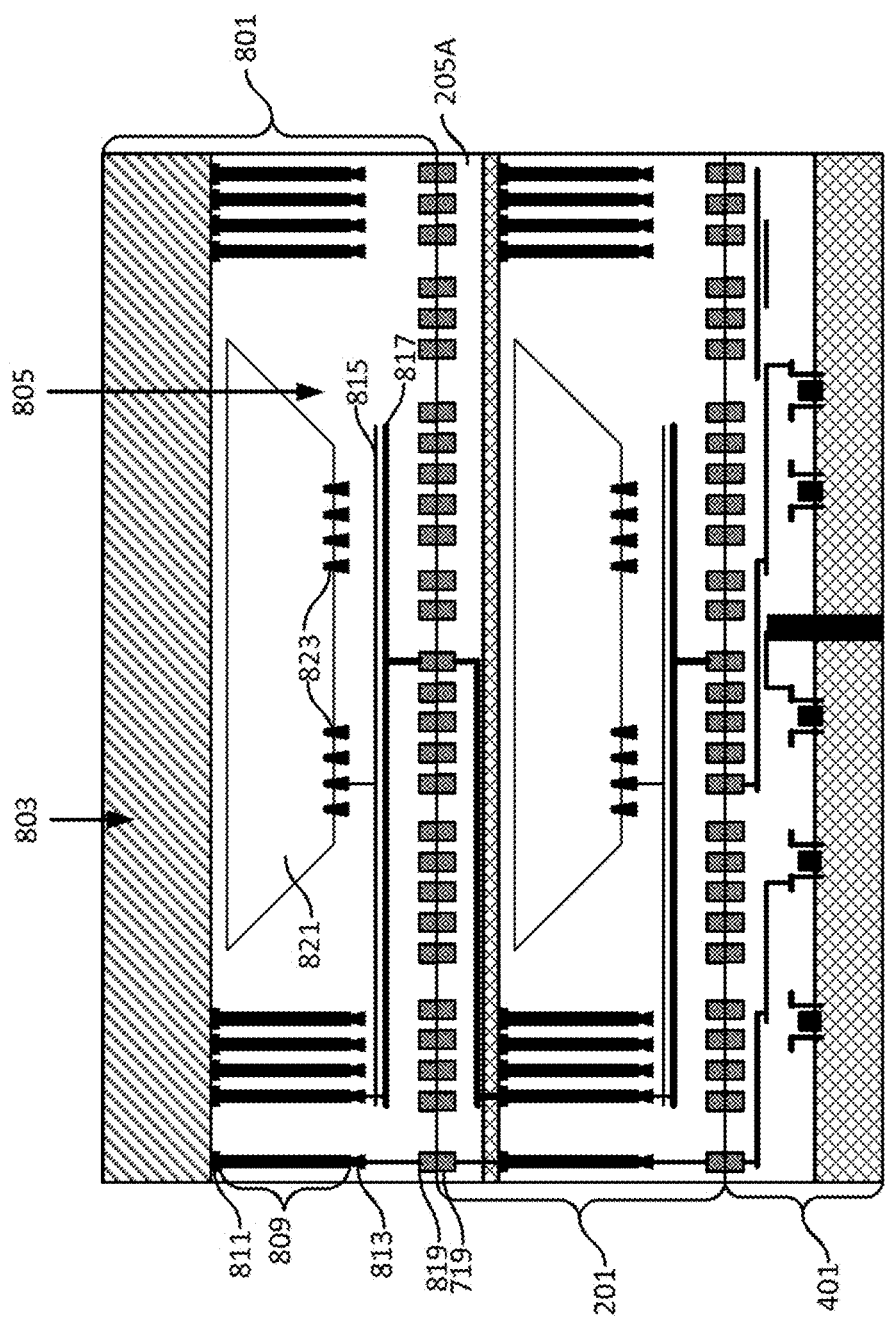
FIG. 8 is an example illustration of an additional memory section formed and bonded to another memory section in accordance with aspects of the disclosure.

FIG. 8 illustrates an example additional memory section 801 being formed on a sacrificial substrate 803 and being bonded to the backside of memory section 201, as provided in blocks 111 and 113 of FIG. 1. Although additional memory section 801 is shown as having the same components and layout of memory section 201, additional memory sections may have different components and/or layouts. As shown in FIG. 8, additional memory section 801 includes oxide layer 805 and sacrificial substrate 803. A memory pyramid 821 is within oxide layer 805. The additional memory section 801 also includes connectors 823 which attach the bit lines of memory pyramid 821 to one or more through-stack vias 809 via bit line interconnect 815. Through-stack via 809 may include one or more landing pads 811 and interconnects 813. The landing pads 811 and interconnects 213 provide connection points for the vias 809 to hybrid bonding pads 819, bit line interconnects 815, and/or a redistribution layer 817. For clarity, not all connectors 823, vias 809, landing pads 811, interconnects 813, and hybrid bonding pads 819 shown in FIG. 8 are labeled. Further, the number of components shown within the memory section 801, such as vias 809, landing pads 811, interconnects 813, hybrid bonding pads 811, bit line interconnect 815, redistribution layer 817, and hybrid bonding pads 819 is simply for illustration. There may be hundreds, thousands, or more of these components within the memory section 801. As is the case with FIG. 2, FIG. 8 illustrates the memory section 201 from a side view, thereby providing only a two-dimensional view of the memory section 201. Additional components in the memory section may be found in the third dimension.

The hybrid bonding pads 819 may be configured to mirror the layout of the additional hybrid bonding pads 719 of the memory section. As such, when the additional memory section 801 is inverted and positioned on the top side of the exposed oxide section 205A of memory section 201 the hybrid bonding pads 819 are aligned with the additional hybrid bonding pads. As described previously, the bonding of memory section 201 to memory section 801 may be done using various bonding techniques, including using direct dielectric bonding, non-adhesive techniques, such as a ZiBond® direct bonding technique, or a DBI® hybrid bonding technique.

Figure 9:
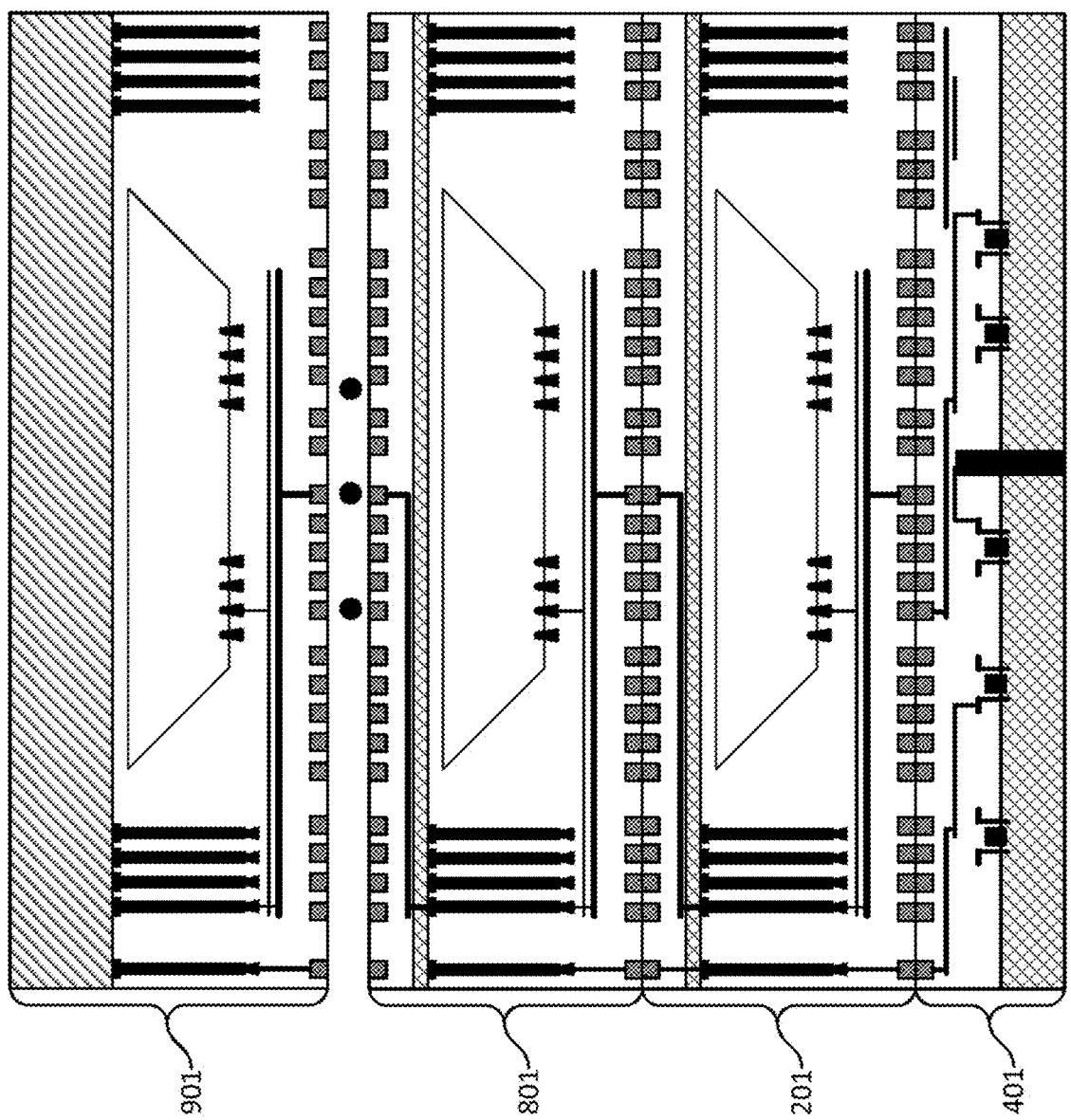
FIG. 9 is an example illustration of three memory sections formed and bonded to a single logic section another memory section in accordance with aspects of the disclosure.

Referring again to FIG. 1, if the SNMMS has the desired number of memory sections, no additional memory sections may be added and the production of SNMMS may end, as shown in blocks 115 and 117. However, if additional memory sections are to be added to the SNMMS, steps 107-115 may be repeated until the number of desired memory sections are on the stacked NAND with multiple memory sections. For instance, and as shown in FIG. 9, additional memory sections may be continually added to the SNMMS until a final memory section 901 is added, at which time the process may end.

The sacrificial substrate of the final additional memory section, such as final memory section 901, may be left one or removed from the completed SNMMS. Although the foregoing examples provide for the formation of additional memory sections each time through the process, there is no time constraint on the formation of the additional memory sections. In this regard, additional memory sections may be formed at the same time and/or in any order and/or at the same time as the base, that is to say first, memory section.

In some instances, the logic section may be added to the multiple memory sections after all of the additional memory sections have been bonded. In this regard, steps 103-105 of FIG. 1 may be skipped the first time through the process, although, as with the formation of the additional memory sections, explained herein, the formation of the logic section (step 103) may occur at any time.

Figure 10:
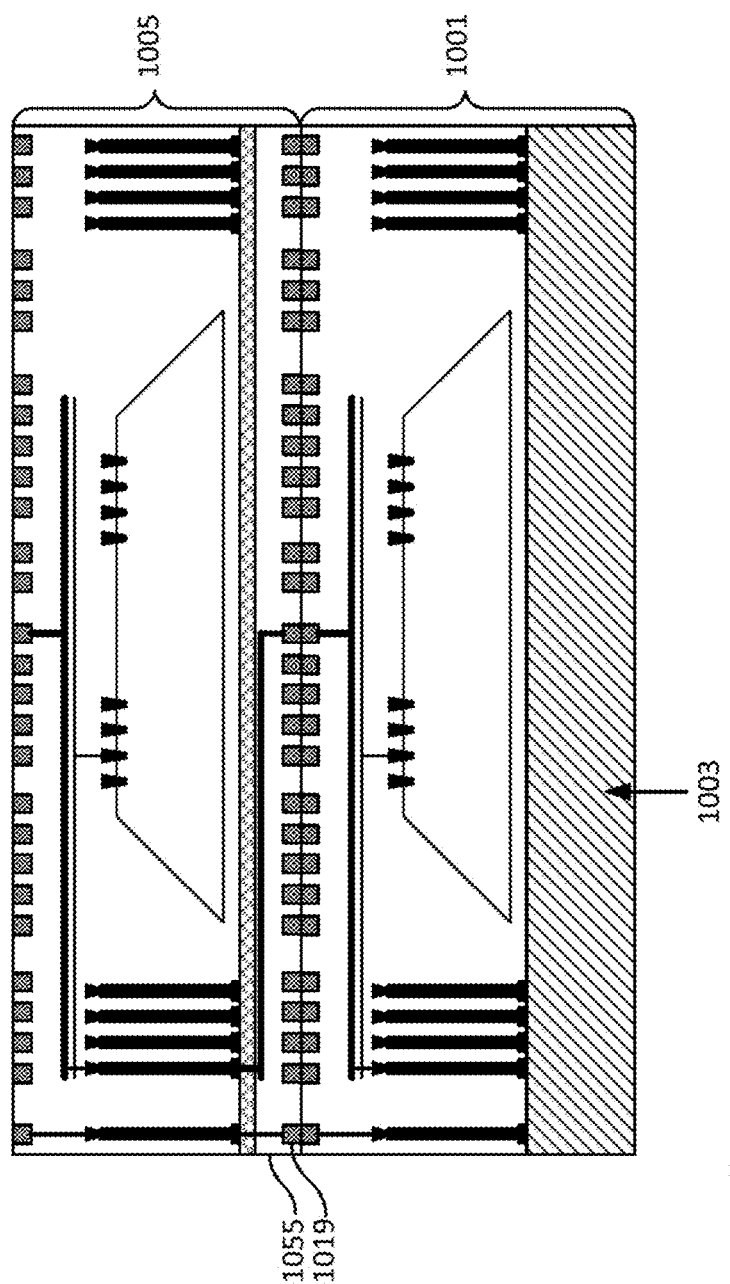
FIG. 10 is an example illustration of a logic section added to bonded multiple memory sections in accordance with aspects of the disclosure.

For example, a memory section, such as memory section 1001 may be formed on a sacrificial substrate 1003, as shown in FIG. 10 and as outlined in steps 107-115 of FIG. 1. An additional memory section 1005, formed on another sacrificial substrate which is subsequently removed, has an additional redistribution layer 1019 formed in the first oxide layer 1055. The additional memory section 1005 is bonded with memory section 1001, as further shown in FIG. 10. As memory section 1001 maintains its sacrificial substrate, the memory section and additional memory section 1005, as well as any other additional memory sections which may be added, may remain upright when being bonded together, although in some instances they may be inverted.

Figure 11:
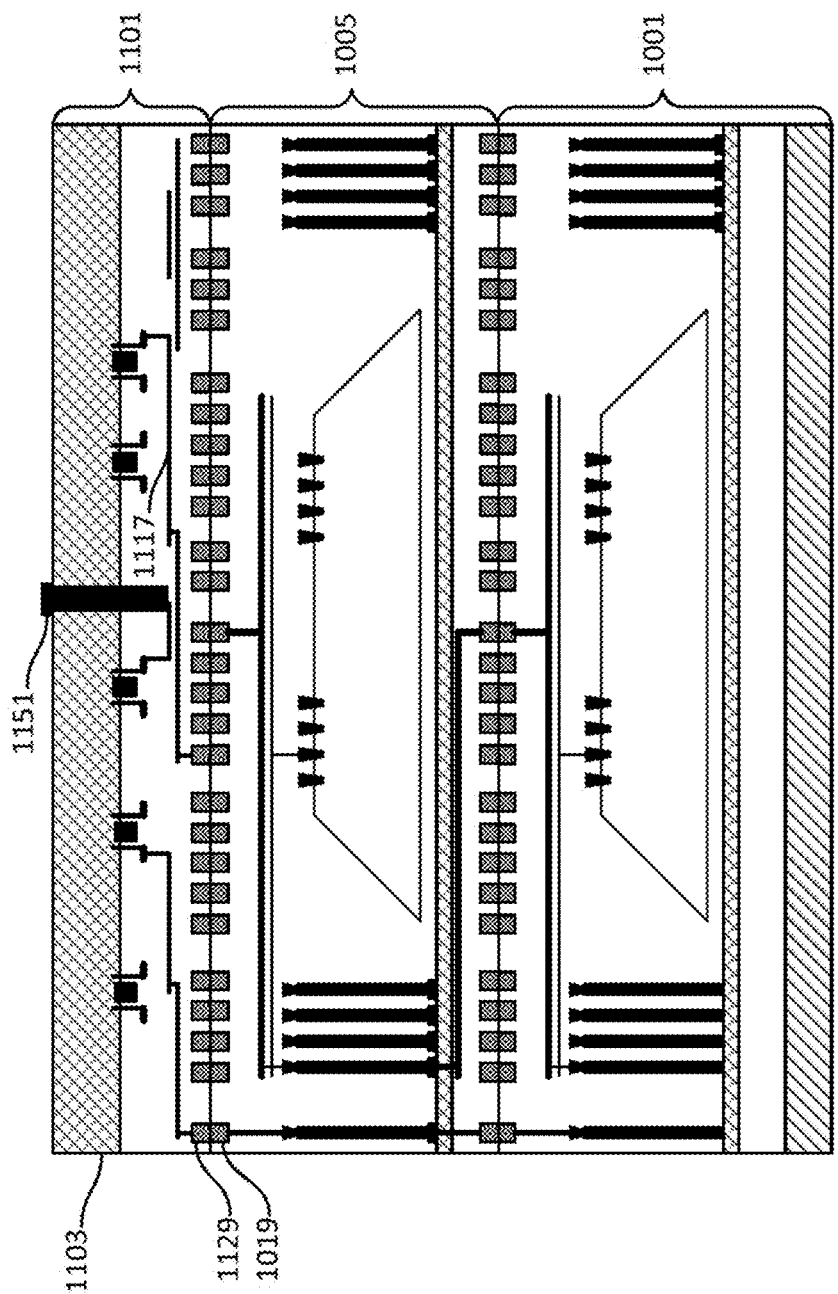
FIG. 11 is an example illustration of an input/output (I/O) pad on a logic section in accordance with aspects of the disclosure.

A logic section may be bonded to the additional memory section 1005 by forming hybrid bonding pads 1129, which mirror the layout of the hybrid bonding pads 1019 of the topmost memory section, which is another memory section 1005 in FIG. 11. The logic section 1101 may be bonded to the another memory section 1005 using the bonding techniques described herein.

In some instances, input/output (i/o) pads may be formed on the logic section to allow for communication between the SNMMS with other electrical devices. In this regard, exposed portion of the logic section, such as logic section 1101 in FIG. 11, may be polished to recess the substrate 1103. An i/o pad 1151 may be formed through the substrate 1103 and in connection with the distribution layer 1117 and/or hybrid bonding pads 1129 of the logic layer. Although FIG. 11 shows a single i/o pad 1151, any number of input pads may be formed. Moreover, i/o pads may be formed before or after connecting the logic section with memory sections.

FORMING STACKED NAND WITH MULTIPLE MEMORY SECTIONS WITH REMAINING SACRIFICIAL SUBSTRATE

Figure 12:
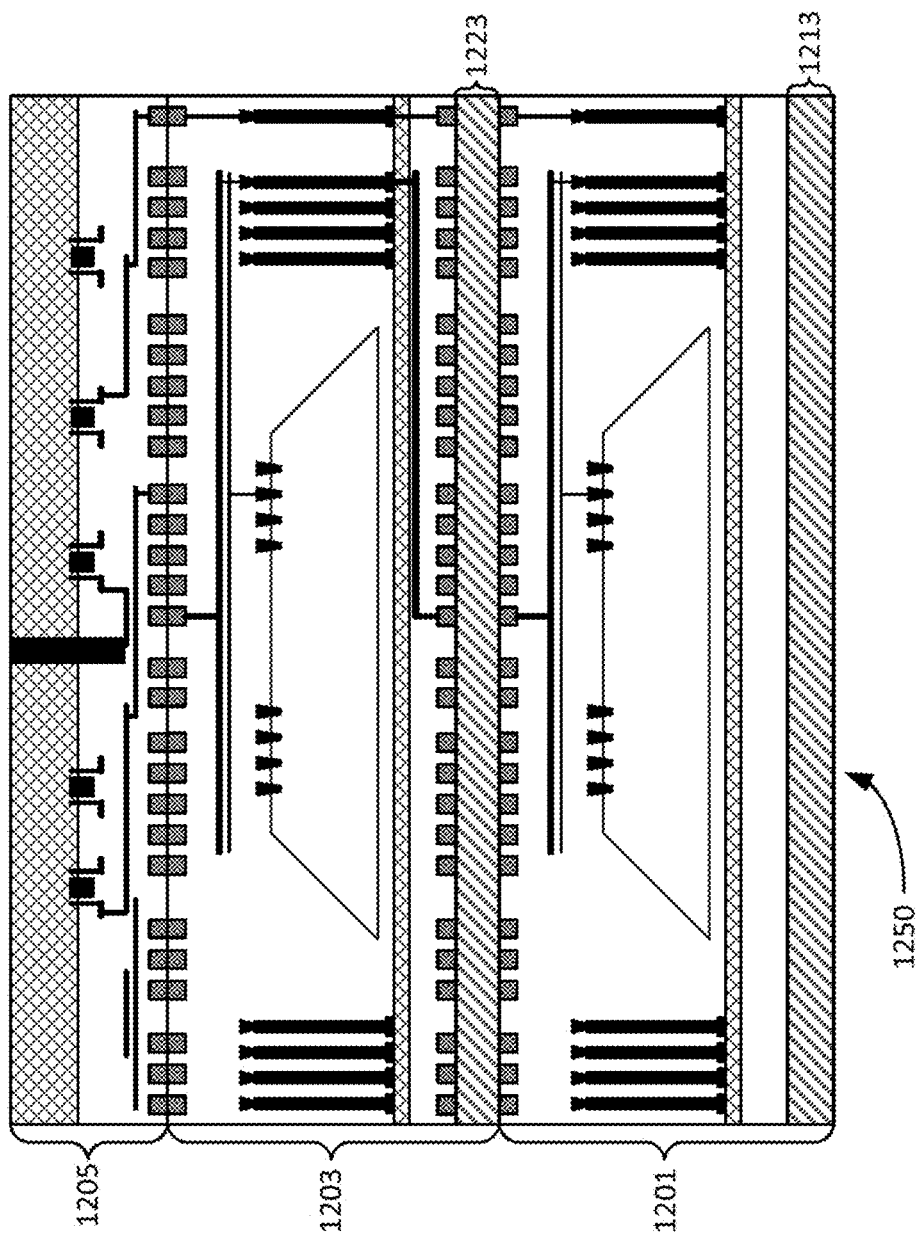
FIG. 12 is an example illustration of stacked NAND with remaining sacrificial substrate in accordance with aspects of the disclosure.

In some instances, additional silicon may be needed for additional components, such as legacy logic including analog circuits, switching, multiplexing, etc. In this regard, not all of the sacrificial substrate may be removed during formation of the SNMMS. For instance, a stacked NAND with multiple memory sections 1250 may include memory sections 1201 and 1203, as shown in FIG. 12. A logic section 1205 may be bonded, or otherwise connected to the memory sections.

To provide space for additional components, some, or all of the sacrificial substrates 1213, 1223 of memory sections 1201 and 1203, respectively, may be left behind during formation of the stacked NAND 1250. Referring to FIG. 1, step 107 which shows the sacrificial substrate being removed, may be skipped, or the amount of sacrificial substrate being removed may be less than all of the sacrificial substrate. Bonding or otherwise connecting the logic section and memory sections through the sacrificial substrate may be performed using the connecting and bonding techniques described herein.

MATRIX OF STACKED MEMORY PYRAMIDS

As described herein, memory pyramids are generally three-dimensional arrays of memory cells are stacked in vertical layers on a die to form memory cell stacks. By stacking the memory cells vertically, the density of the NAND memory is increased. However, slowdown from stacking memory cells may occur when larger arrays of memory cells having larger page sizes are stacked, as horizontal and vertical distance are added to each read and write action. In this regard, NAND is typically written and, in most instances, read in complete pages. As such, an entire row in a layer of the memory pyramid, which forms a single page, is required to perform a read or write operation in the memory pyramid. In some instances, an entire layer or sum of layers may comprise a page.

When stacking memory pyramids, as described herein, a 1× array of memory pyramids is formed. By arranging the memory pyramids in a 1× array, all memory pyramids can abut logic via bit lines and word lines and, in some instances, other connectors, distribution layers, redistribution layers, etc. However, the further the memory pyramid is from the logic, the more time to perform write and read operations is required. Memory pyramids having smaller page sizes and fewer layers may be used to reduce these problems. However, reducing the page size too much may more pages to be read and written, thereby reducing both I/O efficiency and density.

To address these issues, a page having an identified efficient size, which may be dependent upon the type of data stored in the memory pyramids and/or the use case of the SNMMS, may be spread across the same layer of the memory pyramids. In this regard, the sum of the page sizes in the layers of the memory pyramids may be equal to, or near the identified efficient page size. As such, each layer in the memory pyramid may be smaller, thereby reducing the amount of time to access and/or write to an identified page.

Figure 13:
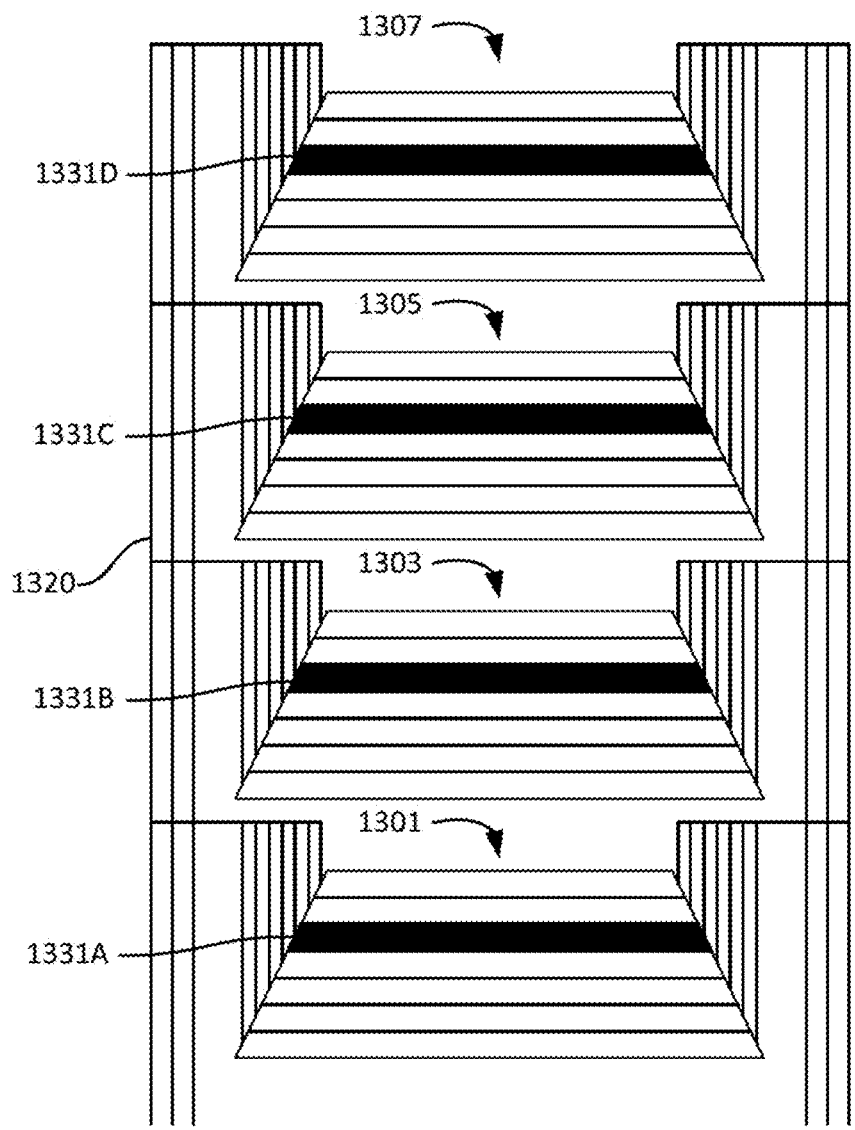
FIG. 13 is an example illustration of stacked memory pyramids in accordance with aspects of the disclosure.

For instance, and as shown in FIG. 13, four memory pyramids 1301-1307 may be stacked, as described herein. Each memory pyramid 1301-1307 may be connected to bit lines 1320 and word lines, such as word lines 1331A-1331D. Each word line may be connected to memory cells which forms a page in the memory pyramid. For clarity, only a single word line in each memory pyramid is identified. In addition, each memory pyramid may be in a different orientation than shown in FIG. 13.

The bit lines can be routed, multiplexed, jogged, layered, etc., such that when data is requested from the memory pyramids in the SNMMS, the same word line in each of the memory pyramids is accessed. For instance, and as shown in FIG. 13, data from the pages corresponding to word lines 1331A-1331D may be requested. Each word line 1331A-1331D may be activated concurrently. The data from within the word lines may then be combined together during a read operation.

In some instances the page size of each memory pyramid may be sized such that there is sufficient amount of logic within the SNMMS. In this regard, if additional logic is necessary, more layers may be added to each of the memory pyramids, thereby providing more space for additional logic.

In some instances, the SNMMS can be configured to access just a single row of a single memory pyramid or rows in a subset of the memory pyramids. This may increase the access time for a small bit of data, but may reduce efficient use of the density of the SNMMS.

DOUBLE SIDED SILICON

Figure 14:
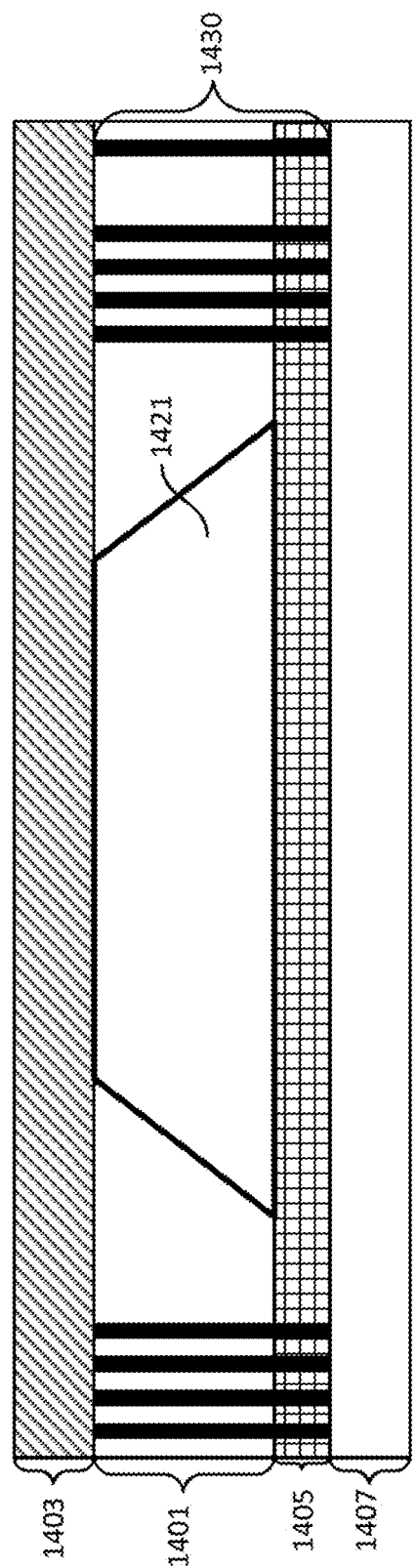
FIG. 14 is an example illustration of a NAND memory using double sided silicon in accordance with aspects of the disclosure.

To reduce the temperatures which the logic section of NAND memory is exposed to, the logic section may be produced on the opposite side of silicon on which the memory section(s) are formed. For instance and as shown in FIG. 14, a memory section 1401, including memory pyramid 1421 may be produced on a first side of a silicon substrate 1405. A sacrificial substrate 1403 may be bonded to the memory section 1401 on the side opposite of the silicon substrate 1405. A logic section 1407 may be produced on the silicon substrate 140 on the side opposite of the memory section 1401. Vias, such as vias 1430, or other such connections, may connect the memory section 1401 to the logic section 1407 through the silicon substrate 1405. The silicon substrate may act as a thermal barrier, protecting the logic section from high temperatures which may be produced by the memory sections during operation.

Figure 15:
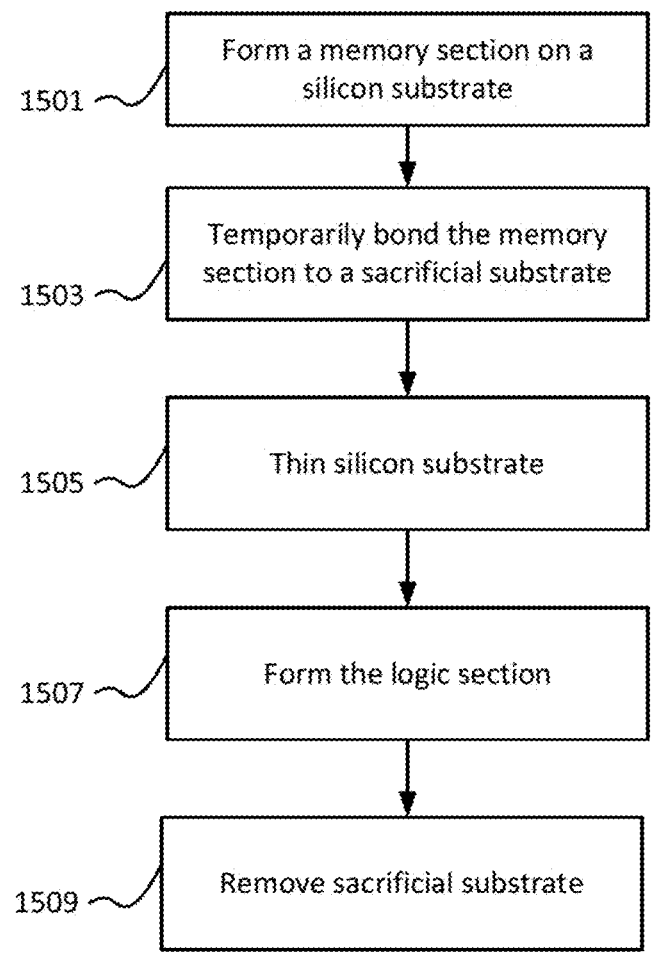
FIG. 15 is an example flow diagram in accordance with aspects of the disclosure.

Flowchart 1500 of FIG. 15 illustrates a method for forming NAND memory using double sided silicon. A memory section, such as memory section 1401, may be formed on a silicon substrate, such as silicon substrate 1405, as shown in block 1501. Although only a single memory section 1401 is shown in FIG. 14, any number of memory sections may be formed on the silicon substrate 1405. In this regard, memory sections may be formed directly on the silicon substrate or in a stacked formation, such as in the case of SNMSS.

As shown in block 1503, a sacrificial substrate, such as sacrificial substrate 1403, may be bonded to the memory section. The sacrificial substrate may provide support for the NAND during further production as described herein.

As shown in block 1505 of FIG. 15, the silicon substrate may be thinned. Thinning the silicon substrate, such as silicon substrate 1405, may reduce the thickness of the vias which may be formed through the silicon substrate. In this regard, vias in thick silicon may be wider than vias formed in thinner silicon. The pitch of vias through a thick layer of silicon may be too wide to be usable. By reducing the thickness of the silicon, thinner vias may be released and the pitch of the thinner vias may allow for the necessary density of vias through the silicon. The thickness of the silicon substrate may be between 5-500 um, or more or less.

As shown in block 1507 of FIG. 15, a logic section may be formed on the opposite side of the silicon substrate, such as silicon substrate 1405. Although FIG. 14 shows silicon substrate 1405 and logic section 1407 as being separate sections, the logic section 1407 may be formed within the silicon substrate. In this regard, laser spike annealing may be used to selectively anneal regions of the silicon substrate to form the necessary logic components. By laser spike annealing the logic, heating during the formation of the logic may be minimized, thereby reducing the risk of heat damage to the memory section or other regions of the NAND. In some instances, the sacrificial substrate may be removed, as shown in block 1509.

INTERCONNECTIONS

The layout of the memory sections and/or logic sections within the SNMMS may be consistent. In this regard, the orientation, position, size, etc., of each memory section may be the same. By maintaining the layout of the memory sections within a SNMMS, bonding the memory sections together and/or memory sections with a logic section may be simplified as the bonding surfaces, such as hybrid bonding pads, may be easily aligned. Moreover, formation of the circuitry within each memory section and/or logic section may be repeated, easing production costs and reducing the complexity of accessing the memory pyramids. Although the layouts of the memory sections and/or logic section may be different, such a SNMMS may be more difficult to produce and/or operate than SNMMS having the same layout.

Connecting circuitry through bonded memory sections having consistent layouts may be done by forming jog-overs. In this regard, jog-overs may connect each via of a first memory section to a respective via of another memory sections bonded together with the first memory section. In instances where the memory sections have similar layouts, the jog-overs may connect the vias of the first memory section to vias of the other memory section located one pitch over, thereby creating a "staircase" pattern. As vertical electrical load may be smaller than the horizontal load on the same section, it may be more efficient electrically to drive vertically.

Figure 16:
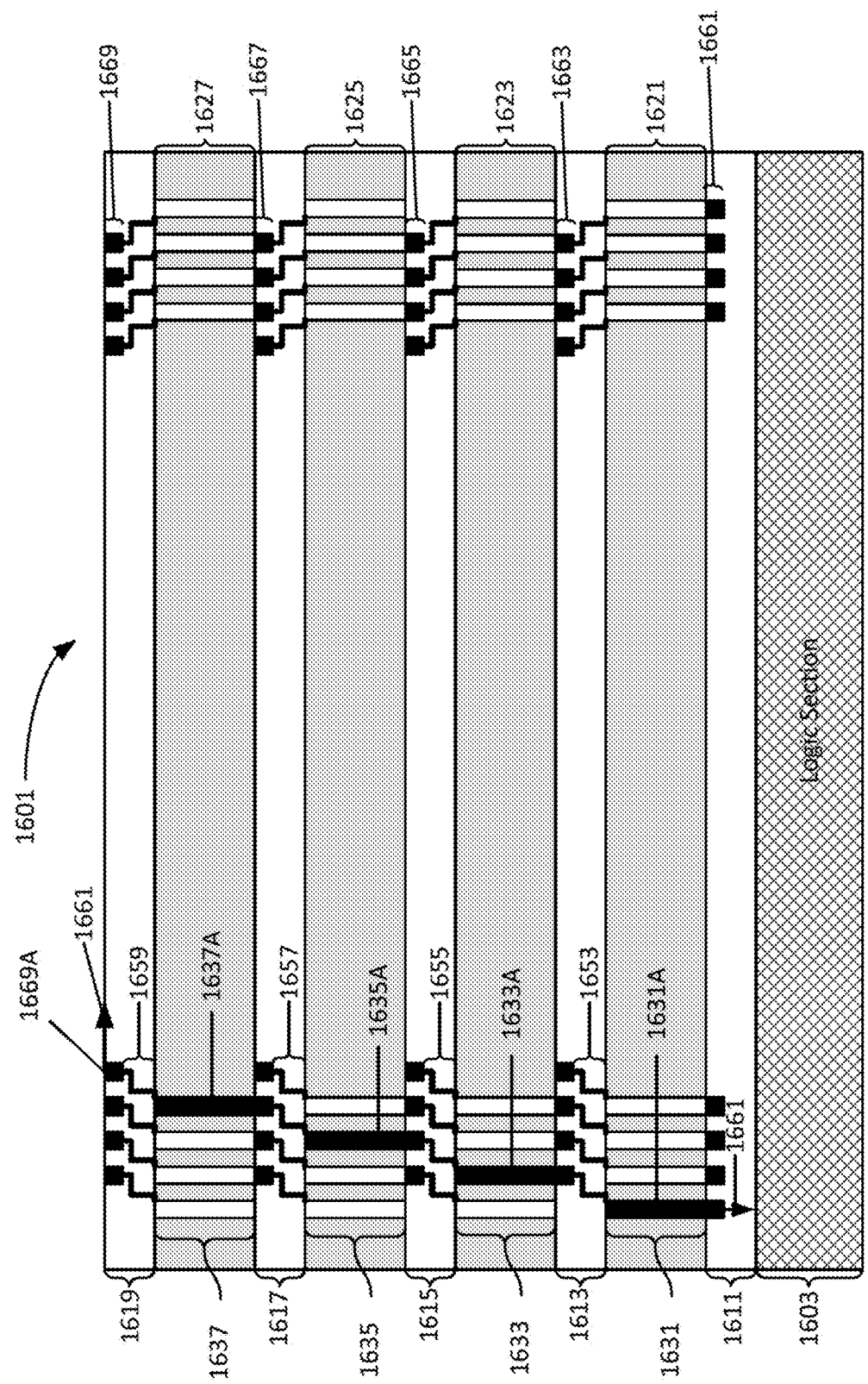
FIG. 16 is an example of jog-over interconnections in accordance with aspects of the disclosure.

For example, the SNMMS 1601 of FIG. 16 includes four memory sections 1621-1627 and five silicon layers 1611-1619. Within each memory section are vertical vias including vias 1631-1637 in memory sections 1621-1627, respectively. Within, or on, the silicon layers are hybrid bonding pads including hybrid bonding pads 1661-1669 in silicon layers 1611-1619, respectively. For clarity, only some of the hybrid bonding pads and vias are identified in FIG. 16. In some instances, the silicon layers may be removed, and the hybrid bonding pads may attach directly to jog-overs. Although not illustrated, circuitry such as analog circuits, switching, multiplexing, etc., can be on each memory section and/or the logic section.

Jog-overs 1653-1659 connect the vias to hybrid bonding pads positioned above an adjacent via. When the memory sections are bonded together, the hybrid bonding pads may be bonded to a via one pitch over. For instance, as further illustrated in FIG. 16, one of jog-overs 1659 may connect hybrid bonding pad 1669A with via 1637A, located one pitch over. The jog-overs may be any type of route, such as vias and traces.

Although the jog-overs are shown as being implemented in the silicon layers 1611-1619, the jog-overs may be formed within the memory sections 1621-1627 and/or within redistribution layers within the silicon layers or memory sections. In some instances, jog-overs may be used in other memory and electronic devices to provide for interconnections between sections.

The jog-overs may enable each memory section to be individually routed. In this regard, the same layout may be used in each memory section without the need for vias to serve more than one connection. The jog-overs allow for the same or nearly the same design of memory section to be reused in each layer and yet have different connectivity based upon het layer a given memory section sits within the stack. For example, by forming the jog-overs such that they carry the signal to hybrid bonding pads one pitch over, the signal may be directly passed to and from the logic section from a respective memory section. For instance and as further shown in FIG. 16, hybrid bonding pads 1669A may connect with memory section 1619. A signal 1661 may pass through a plurality of vias, including vias 1637A, 1635A, 1633A, and 1631A and through corresponding jog-overs 1659, 1657, 1655, 1653, such that the signal 1661 can be passed to and from the logic section to memory section 1621.

In some instances, each section or sections of SNMSS may be offset by a pitch during formation. For instance, and referring to FIG. 16, instead of, or in addition to forming jog-overs 1653-1659, silicon layers 1611-1619 and/or memory sections 1621-1627 may be shifted by one pitch. In one example, memory section 1625 may be shifted one pitch to the right to align via 1635A with via 1637A. Sacrificial substrates sacrificial substrate 1623 and 1621 may also be shifted may by two and three pitches, respectively. The number of shifted vias may or may not be consistent between dies, although, the number of vias shifted would preferably be the same between each section or sections of SNMSS, as each section may have the same jog over structure. In some instances, the number of shifted vias may be one via, two vias, 10,000 vias, or more or less By doing such, vias 1631A, 1633A, 1635A, and 1637A may all be aligned.

Figure 17:
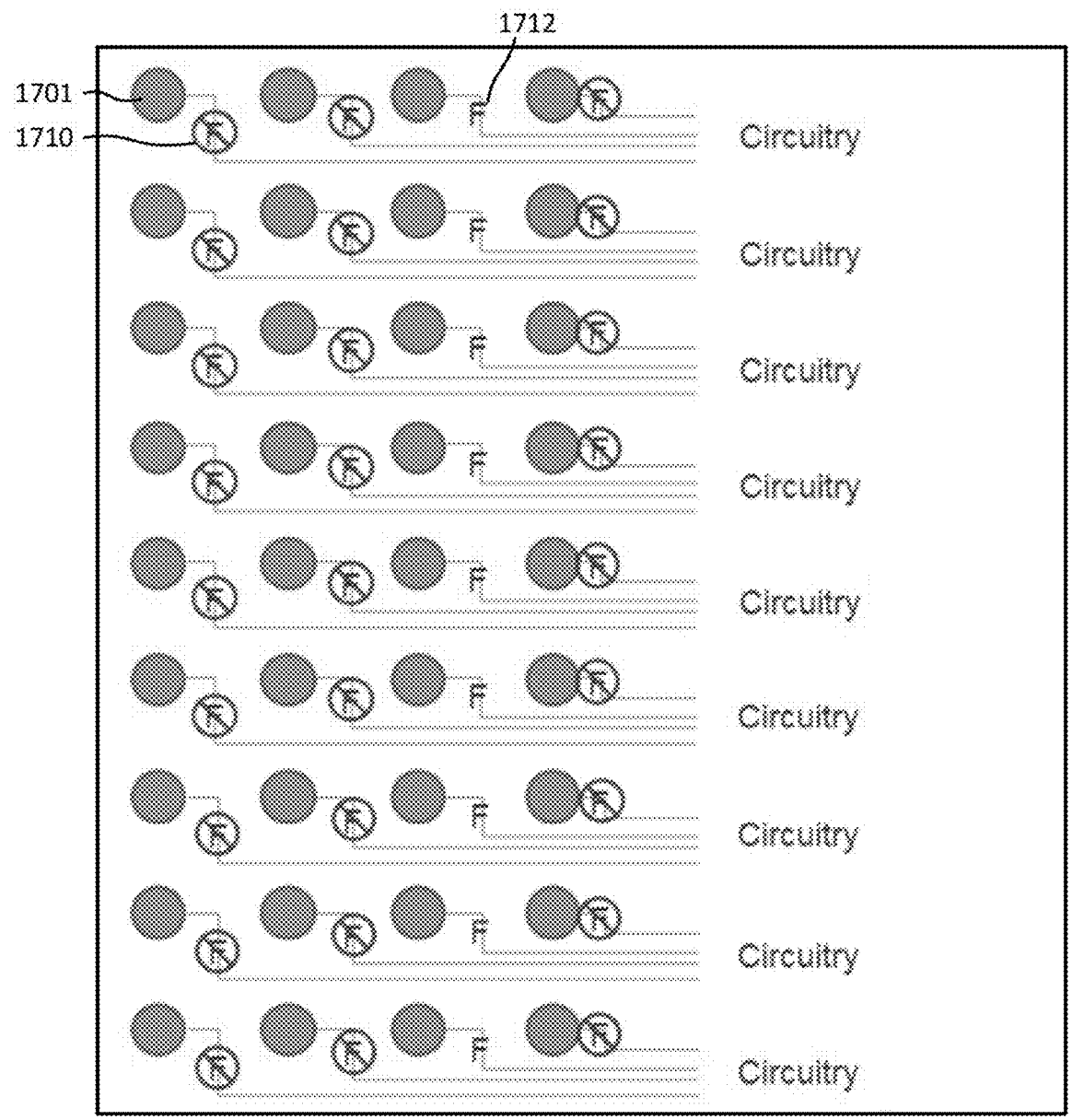
FIG. 17 is an example of fuse and antifuse interconnections in accordance with aspects of the disclosure.
Figure 18:
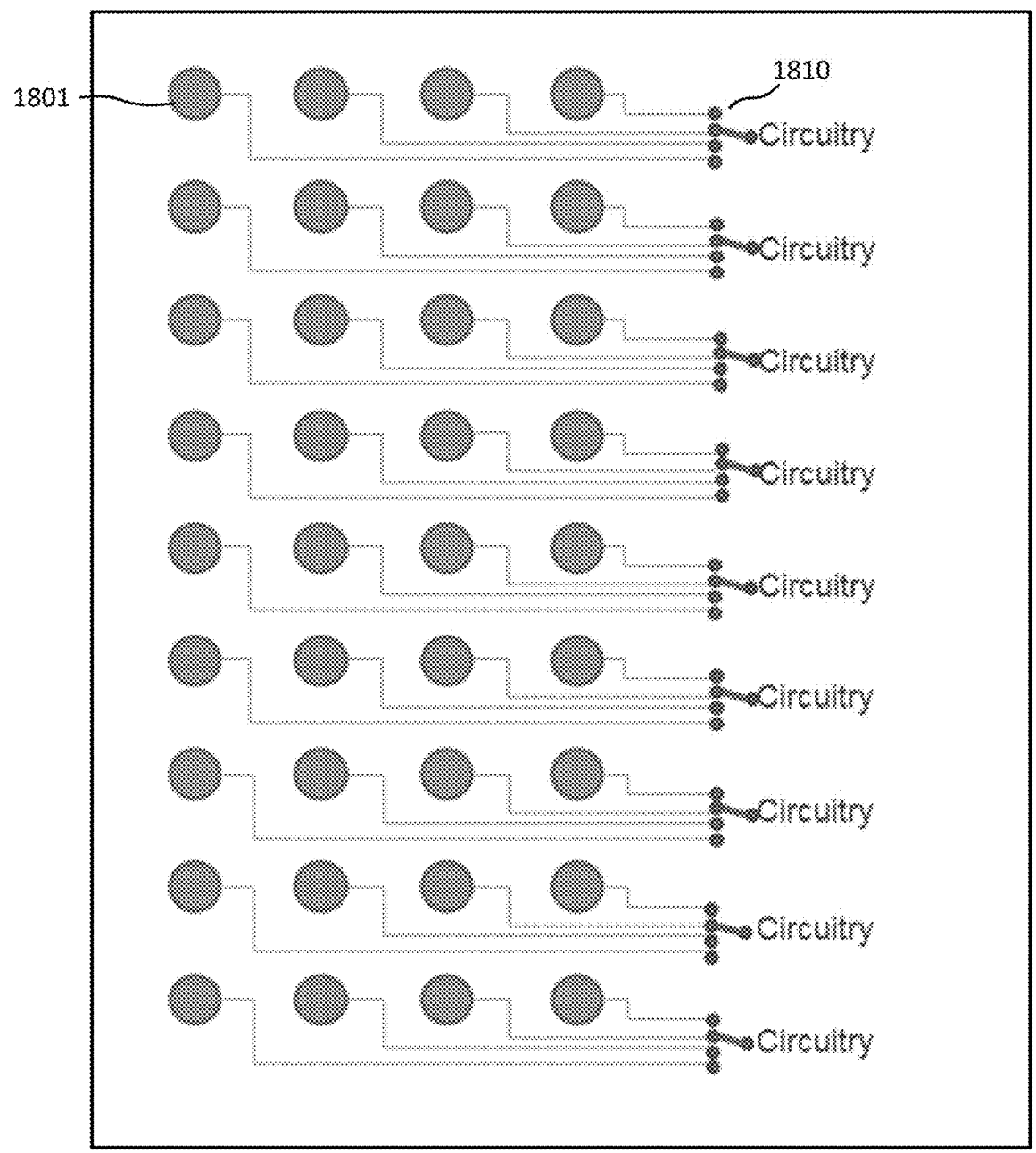
FIG. 18 is an example of multiplexer interconnections in accordance with aspects of the disclosure.

FIGS. 17 and 18 show interconnection interfaces for joining vias with fuses and multiplexers, respectively. FIG. 17 shows an electrical selection system comprised of fuses 1710, also referred to as efuses, and anti-fuses 1712. The fuses and anti-fuses may be used to assign the addressability of a memory pyramid in a given section of SNMSS, such as a memory section, through vias 1701. For clarity, only a single via, fuse, and anti-fuse are labeled in FIG. 17. The placement of the fuses and anti-fuses is configured to provide a reproducible design that can be used to differentiate which section is addressed by which via and corresponding circuitry. In other words, the fuses and antifuses may assign the vias that will be active for a give section.

FIG. 18 shows another way to address a given section in a SNMMS using a switch and/or multiplexer 1810. In this regard, the switch and/or multiplexer 1810 may control which via 1801 is active in a particular section by connecting circuitry for a particular via of that section. For clarity, only a single via, and switch/multiplexer are labeled in FIG. 18.

Unless stated otherwise, the foregoing alternative examples are not mutually exclusive. They may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. As an example, the preceding operations do not have to be performed in the precise order described above. Rather, various steps can be handled in a different order or simultaneously. Steps can also be omitted unless otherwise stated. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method of forming stacked memory with multiple memory sections, the method comprising:
    providing a first memory section formed on a first sacrificial substrate, wherein the first memory section includes a set of landing pads adjacent to the first sacrificial substrate;
    providing a logic section formed on a substrate;
    bonding the logic section on the substrate to the first memory section on the first sacrificial substrate;
    removing the first sacrificial substrate from the first memory section;
    subsequent to removing the first sacrificial substrate, adding a redistribution layer to the first memory section, where the redistribution layer is connected to the set of landing pads;
    providing a second memory section having a second sacrificial substrate; and
    bonding the second memory section to the first memory section.

2. The method of claim 1, wherein the second memory section is bonded to a surface of the first memory section opposite another surface of the first memory section where the logic section is bonded.

3. The method of claim 1, wherein the first memory section includes a first set of hybrid bonding pads and the logic section includes a second set of hybrid bonding pads, and bonding the first memory section to the logic section includes bonding the first set of hybrid bonding pads to the second set of hybrid bonding pads.

4. The method of claim 3 wherein the redistribution layer comprises an additional set of hybrid bonding pads on a second surface of the first memory section, wherein the second surface of the first memory sections is opposite a first surface of the first memory section where the first set of hybrid bonding pads are formed.

5. The method of claim 4, wherein the bonding the second memory section to the first memory section includes bonding the additional set of hybrid bonding pads to a set of hybrid bonding pads on the second memory section.

6. The method of claim 1, further comprising:
    removing the second sacrificial substrate and forming an additional set of hybrid bonding pads on a second surface of the second memory section, wherein the second surface is opposite a first surface of the second memory section where the second memory section is bonded to the first memory section.

7. The method of claim 6, further comprising:
    bonding a third memory section to the second memory section, wherein bonding the third memory section and the second memory section includes bonding a set of hybrid bonding pads on the third memory section to the additional set of hybrid bonding pads of the second memory section.

8. The method of claim 1, wherein bonding the logic section to the first memory section and bonding the second memory section to the first memory section includes ZiBond direct bonding and/or direct bond interconnect (DBI) hybrid bonding.

9. The method of claim 5, wherein the first memory section includes a first set of vias and the second memory section includes a second set of vias, and
    wherein bonding the additional set of hybrid bonding pads to the set of hybrid bonding pads on the second memory section connects one or more vias of the first set of vias with one or more vias of the second set of vias.

10. The method of claim 9, wherein one or more vias of the first set of vias are connected to a memory pyramid in the first memory section and one or more vias of the second set of vias are connected to a memory pyramid in the second memory section.

11. A method of forming stacked memory with multiple memory sections, the method comprising:
    providing a first memory section formed on a surface of a sacrificial substrate, wherein the first memory section includes a set of landing pads adjacent to the sacrificial substrate;
    providing a logic section formed on a substrate;
    bonding the logic section on the substrate to the first memory section on the sacrificial substrate;
    removing the sacrificial substrate from the first memory section; and
    subsequent to removing the sacrificial substrate, adding a redistribution layer to the first memory section, wherein a first side of the redistribution layer is connected to the set of landing pads and a second opposing side of the redistribution layer comprises a first set of hybrid bonding pads.

12. The method of claim 11, wherein the first memory section includes a second set of hybrid bonding pads and the logic section includes a third set of hybrid bonding pads, and bonding the first memory section to the logic section includes bonding the second set of hybrid bonding pads to the third set of hybrid bonding pads.

13. The method of claim 12, further comprising providing a second memory section having a second sacrificial substrate; and
    bonding the second memory section with the first memory section.

14. The method of claim 13, wherein the second memory section is bonded to a surface of the first memory section opposite another surface of the first memory section where the logic section is bonded.

15. The method of claim 14, wherein the bonding the second memory section to the first memory section includes bonding the first set of hybrid bonding pads to a set of hybrid bonding pads on the second memory section.

16. The method of claim 13, further comprising:
removing the second sacrificial substrate and forming an additional set of hybrid bonding pads on a second surface of the second memory section, wherein the second surface of the second memory section is opposite a first surface of the second memory section where the second memory section is bonded to the first memory section.

17. The method of claim 16, further comprising:
bonding a third memory section to the second memory section, wherein bonding the third memory section to the second memory section includes bonding a set of hybrid bonding pads on the third memory section to the additional set of hybrid bonding pads of the second memory section.

18. The method of claim 15, wherein the first memory section includes a first set of vias and the second memory section includes a second set of vias, and
wherein bonding the first set of hybrid bonding pads and the set of hybrid bonding pads on the second memory section connects one or more vias of the first set of vias with one or more vias of the second set of vias.

19. The method of claim 18, wherein one or more vias of the first set of vias are connected to a memory pyramid in the first memory section and one or more vias of the second set of vias are connected to a memory pyramid in the second memory section.

20. A method of forming stacked memory with multiple memory sections, the method comprising:
providing a first memory section formed on a surface of a sacrificial substrate, wherein the first memory section comprises a first set of hybrid bonding pads on a first side of the first memory section, and wherein the first memory section includes a set of landing pads adjacent to the sacrificial substrate;
providing a logic section formed on a substrate, wherein the logic section comprises a second set of hybrid bonding pads;
hybrid bonding the first set of hybrid bonding pads to the second set of hybrid bonding pads to connect the logic section to the first memory section;
removing the sacrificial substrate from the first memory section;
subsequent to removing the sacrificial substrate, adding a redistribution layer to the first memory section, wherein a first side of the redistribution layer is connected to the set of landing pads and a second, opposing side of the redistribution layer comprises a third set of hybrid bonding pads on a second, opposite side of the first memory section; and
hybrid bonding a second memory section comprising a fourth set of hybrid bonding pads to the third set of hybrid bonding pads.

* * * * *